United States Patent [19]

Helms

[11] Patent Number: 4,947,136

[45] Date of Patent: Aug. 7, 1990

[54] VARIABLE GAIN DISTRIBUTED AMPLIFIER

[75] Inventor: David R. Helms, Liverpool, N.Y.

[73] Assignee: General Electric Company, Syracuse, N.Y.

[21] Appl. No.: 408,678

[22] Filed: Sep. 18, 1989

[51] Int. Cl.⁵ .............................................. H03F 3/60
[52] U.S. Cl. ...................................... 330/54; 330/277; 330/278
[58] Field of Search ................... 330/54, 277, 278, 279

[56] References Cited

U.S. PATENT DOCUMENTS

| | | | |
|---|---|---|---|
| 4,638,190 | 1/1987 | Hwang et al. | 307/512 |
| 4,734,751 | 3/1988 | Hwang et al. | 330/277 X |
| 4,901,032 | 2/1990 | Kumiak | 330/277 |

Primary Examiner—James B. Mullins
Attorney, Agent, or Firm—Richard V. Lang; Paul Checkovich; Robert A. Cahill

[57] ABSTRACT

The invention relates to a variable gain distributed amplifier for use at microwave frequencies, and fabricated in a monolithic microwave integrated circuit format. In the amplifier, the attenuation is varied, based upon digital control of a dual gate segmented FET. The amplifier has a nearly flat insertion phase and amplitude response, and an insertion phase response that varies only slightly between gain settings. The amplifier employs segmented dual gate field effect transistors as the gain elements, having their signal input and signal output electrodes which provide shunt capacities ($C_{GIS}$, $C_{DS}$) interconnected with serial inductances to form separate low pass transmission lines having relatively high cutoff frequencies. The amplifier has means to insure stability and uses Chebyshef equal ripple techniques to linearize the amplitude and insertion phase response.

8 Claims, 6 Drawing Sheets

VARIABLE GAIN DISTRIBUTED AMPLIFIER

BACKGROUND OF THE INVENTION

1. Field of the Invention

The invention relates to variable gain distributed amplifiers and more particularly to variable gain distributed amplifiers implemented in the Monolithic Microwave Integrated Circuit (MMIC) format and suitable to digital control.

2. Prior Art

Variable gain distributed amplifiers are employed when broad band signal processing (i.e. varying gain or attenuation) at microwave frequencies is desired. A known technique is to interconnect a plurality of solid state gain elements, typically field effect transistors, with serial transmission line elements interconnecting the signal input electrodes and signal output electrodes. The serial transmission line elements are then designed to provide series inductive reactances to compensate for shunt capacitive reactances at the input (i.e. signal gate) electrodes and at the output (i.e. drain) electrodes, thereby creating a multisection low pass transmission line. Artificially, the serial reactances can be selected to create relatively high cut-off frequencies compatible with microwave signals of high relative bandwidth.

In variable gain distributed amplifiers a recurrent problem is not only the linearity of the phase and gain response with frequency, but also constancy in the phase response from gain setting to gain setting. Achieving accuracy in phase and amplitude response is more difficult to achieve when wide band operation is sought.

The individual field effect transistors in a distributed amplifier may be controlled for different gain settings. One known distributed amplifier utilizes dual gate field effect transistors in which the signal is applied to the first or signal gate and an analogue gain control voltage is applied to the second or control gate.

The problem with this mode of control of the gain of individual field effect transistors is that the parasitic reactance of the device varies with the voltage on the control gate. While some tailoring may be used to improve the tracking between devices and to achieve linearity in response at one gain setting, the phase response from gain setting to gain setting due to this change in parasitizes differs very substantially.

A recurrent problem in distributed amplifier design is that of avoiding instability at the margins of the operating bandwidth. One known solution is to provide roll-off in individual amplifier sections. This solution undesirably reduces the linear bandwidth of the distributed amplifier.

A known device in which gain may be digitally controlled is a segmented dual gate field effect transistor. In these transistors the transconductance ($G_m$) may be scaled in a desired manner (i.e. binary, geometric, logarithmic) by selective activation of suitably scaled individual segments. When the individual segments are operated at high gain, on state settings, the transconductance ($G_m$) becomes proportional to the gate width of the segment. The parasitizes, i.e. the signal gate to source capacity and the drain to source capacity, however, remain that of the full device, and remain substantially constant. Such devices are described in U.S. Pat. No. 4,638,190 and 4,734,751 to Y. C. Wang et al and assigned to the Assignee of the present application. Such devices are characteristicly fabricated in the MMIC format, while active and passive components are formed on the monolithic substrate.

SUMMARY OF THE INVENTION

Accordingly, it is an object of the invention to provide an improved variable gain distributed amplifier.

It is another object of the invention to provide a variable gain distributed amplifier in which the insertion phase response is essentially the same over a significant range of gain and attenuation settings.

It is still another object of the present invention to provide an improved variable gain distributed amplifier utilizing serial inductances between successive gain elements to form low pass psuedo transmission lines of increased bandwidth.

It is an object of the invention to provide an improved variable gain distributed amplifier in the MMIC format.

It is another object of the invention to provide a variable gain distributed amplifier in the MMIC format having improved stabililty without significant loss of bandwidth or gain.

These and other objects are achieved in accordance with the invention in a novel variable gain distributed amplifier.

The amplifier has a signal input terminal for application of signals, and a plurality of segmented dual gate field effect transistors (SDGFETs), each similarly subdivided into a plurality of selectively activated segments. In each SDGFET, the source, drain, and signal gate electrodes are common to all segments. A control gate electrode is provided divided into segments and disposed between the signal gate electrode and the drain electrode. Control gate terminals are provided for selectively activating specific segments of the SDGFET. Each SDGFET segment has a predetermined width to effect a desired increment in SDGFET transconductance ($G_m$) when activated, while the signal gate to source capacitance ($C_{G1S}$) and the drain to source capacitance ($C_{DS}$) remain constant and substantially unaffected by the status of the segments.

The amplifier further includes a first wideband low pass transmission line means which propagates signals from the signal input terminal to successive signal gates, and which consists of successive shunt capacities to signal ground ($C_{G1S}$) and serial inductances interconnecting the signal gates forming low pass transmission structure for elevating the amplifier cut-off frequency.

A signal output terminal is provided for the distributed amplifier, and a second wideband low pass transmission line means is provided into which signals from the successive drains obtained for propagation to the signal output terminal.

The second transmission line means includes successive shunt capacities to signal ground ($C_{DS}$) and serial inductances interconnecting successive drains for elevating the cut-off frequency.

A control network is provided for selectively activating corresponding segments in each of the SDGFETs to effect equal $G_m$s in each SDGFET.

The invention is carried out in an MMIC format, and includes means to remove amplifier instability through the pass band and to reduce insertion phase through the pass band, and through the various gain and attenuation settings.

BRIEF DESCRIPTION OF THE DRAWINGS

The inventive and distinctive features of the invention are set forth in the claims of the present application. The invention itself, however, together with further objects and advantages thereof may best be understood by reference to the following description and accompanying drawings, in which:

DESCRIPTION OF THE PREFERRED EMBODIMENT

Figure 1:
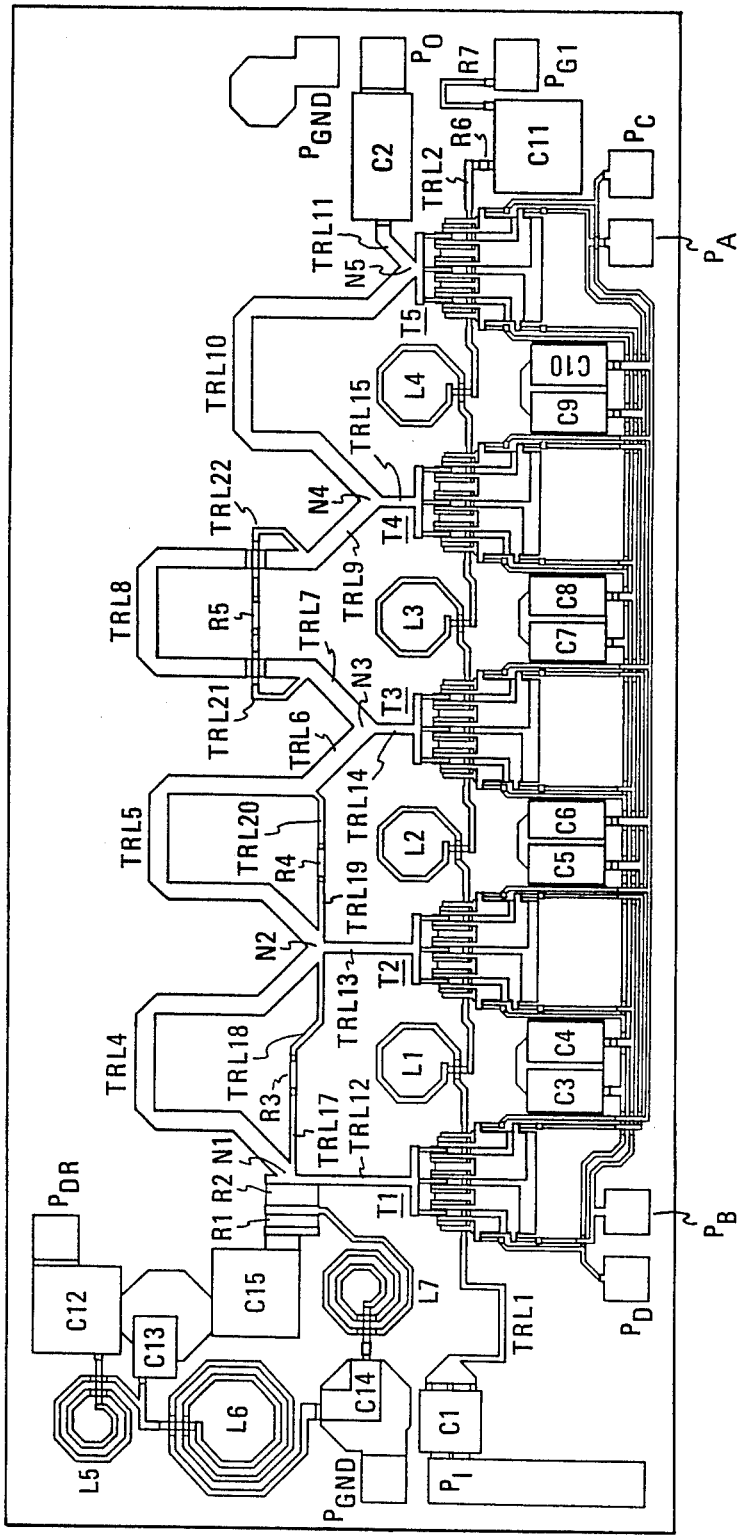
FIG. 1 is an artist's rendering of the layout of the variable gain distributed amplifier implemented in a Monolithic Microwave Integrated Circuit (MMIC) format.

FIG. 1 is an artist's rendering of the layout of a variable gain distributed amplifier embodying the invention and implemented in a monolithic microwave integrated circuit (MMIC) format. In the MMIC format both active and passive devices are formed in place upon a monolithic substrate (10) using known integrated circuit processing techniques. The conventional substrate material for microwave frequencies is either GaAs or one of several compound semiconductors exhibiting the desired high frequency properties.

The MMIC is seen to contain both active and passive components. The active components take the form of segmented dual gate field effect transistors (SDGFETs) and the passive components include inductors, capacitors, resistors, conductor runs, and microstrip transmission line elements. In particular, spirally configured transmission lines form inductors. Superimposed conductive layers separated by an insulating layer form capacitors. Resistors are formed in or on the substrate at interruptions in conductor runs. The conductor runs are used to supply DC control, bias potentials, and to provide microstrip transmission line paths for point to point RF signal connection. For RF transmission, the thickness of the substrate is selected for conveniently achieving 50 ohm characteristic impedances. Finally, the monolithic substrate is provided with bond wire connection pads, usually at the perimeter of the substrate, for external connections.

Referring to FIG. 1, a signal input pad $P_I$ with a 50 ohm microstrip transmission line forming an open circuit stub is provided for applying input signals to the distributed amplifier. A signal output terminal pad $P_O$ is provided for deriving output signals from the distributed amplifier. A grounding pad $P_{GND}$ for RF probing is provided in close proximity to each signal pad. The active elements of the distributed amplifier consist of five SDGFETs $T_1$ to $T_5$.

The signal input pad $P_I$ is used to supply the signal via a blocking capacitor $C_1$, and a transmission line element to the Number 1 or signal gate manifold of the first SDGFET $T_1$. The transmission line element is a part of a low pass transmission line structure containing successive inductors interconnecting the Number 1 or signal gate manifold of successive SDGFETs $T_2$ to $T_5$. The signal output pad $P_O$ derives the signal from the drain manifolds of the SDGFETs $T_1$ to $T_5$, via a transmission line structure terminating at a blocking capacitor $C_2$ coupled to the pad $P_O$.

Figure 3A:
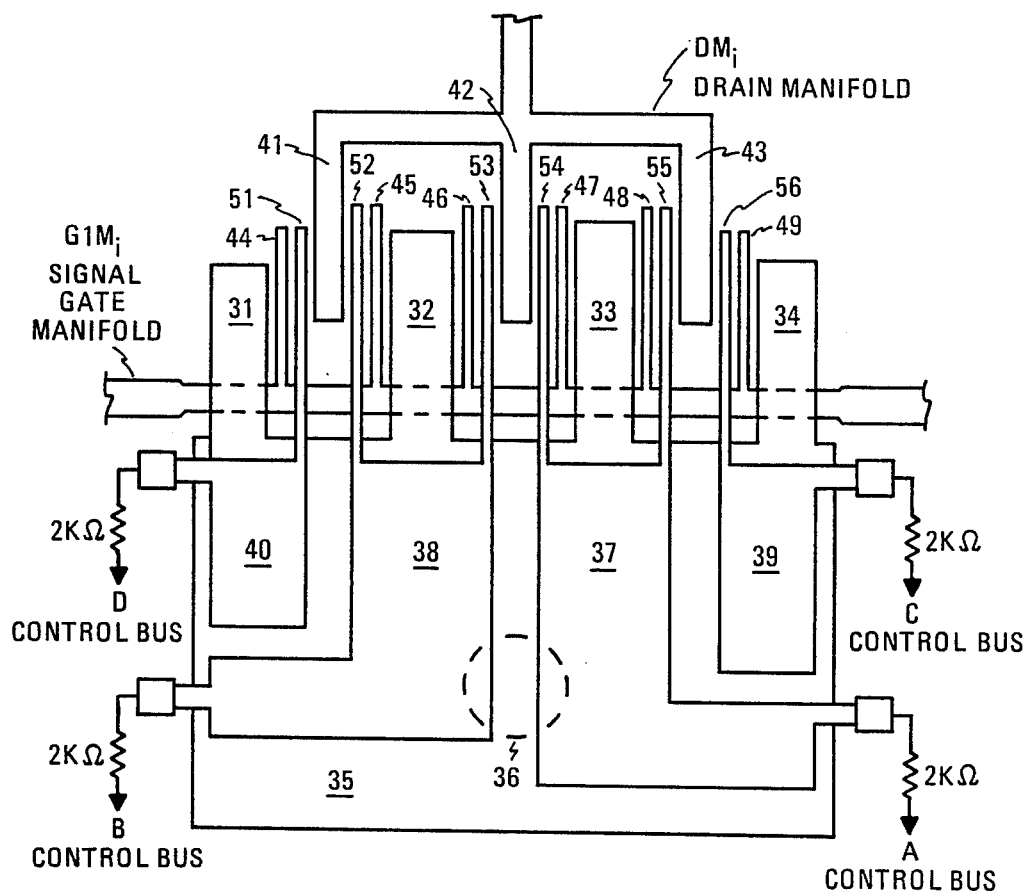
FIG. 3A is an illustration of the layout of a SDGFET used repetitively in FIG. 2, including the source, drain, and Number 1 (or signal) gate manifolds, and the filter structures associated with the Number 2 (or control) gates.
Figure 3B:
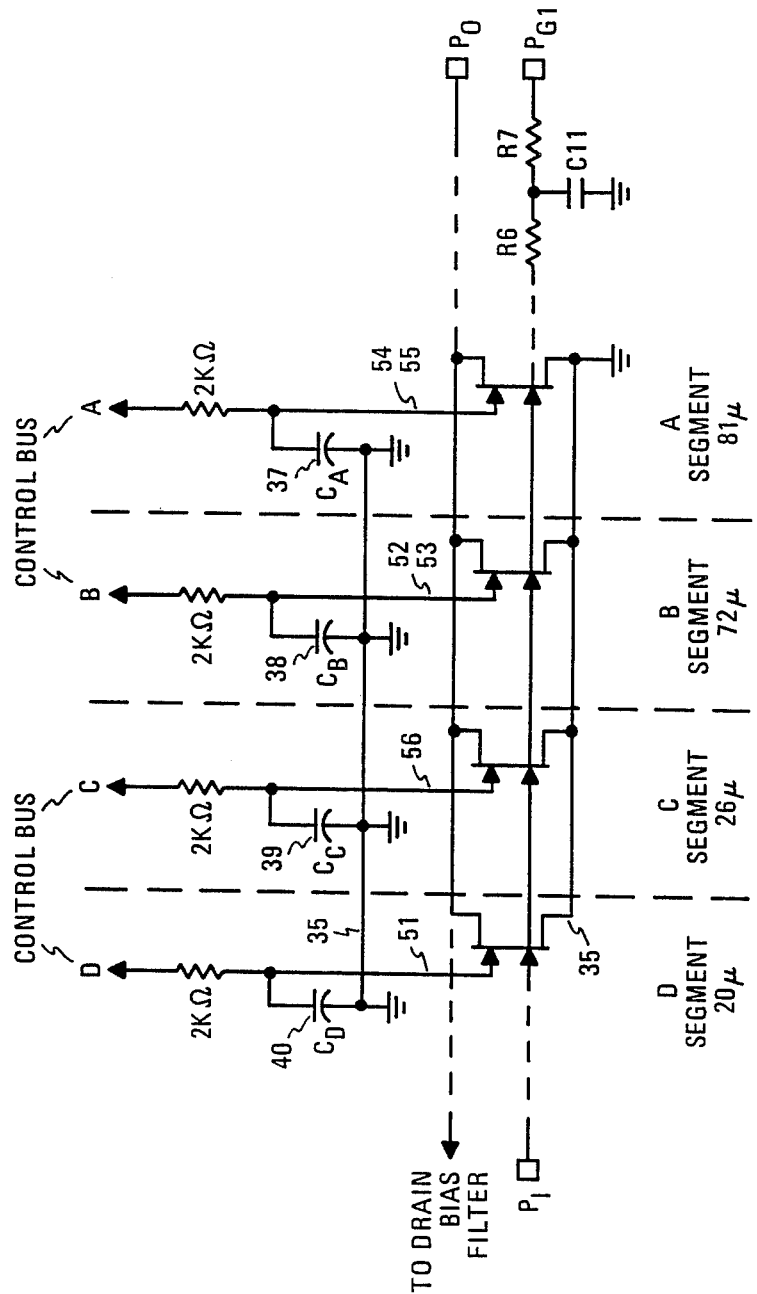
FIG. 3B is a schematic circuit representation of the SDGFET and the portions of the external circuits illustrated in FIG. 3A.

A single SDGFET and the RC filters provided for application of control potentials to the segmented control gates is shown in greater detail in FIGS. 3A and 3B. As will be explained, each SDGFET shown in these figures is subdivided into four segments A, B, C, and D. These segments are suitably scaled to effect a desired series of $g_m$ states as a result of selective activation.

In FIGS. 3A and 3B, as an aid to understanding the segmentation, a representative SDGFET is shown. The SDGFET has a source, drain and a signal (or Number 1) gate electrode common to all segments of the SDGFET and control (or Number 2) gate electrodes which are composed of four separately controlled parts (A, B, C and D) defining the four segments of the SDGFET.

The source electrode is formed of four relatively thick finger like metallizations 31, 32, 33, and 34 which extend upwardly above the signal gate manifold $G1M_i$, which they cross by means of four air bridges. The metallizations 31–34 are connected together by a more extensive metallization 35 remote (via air bridges) from the SDGFET gate region which is grounded through a via hole 36 to the ground plane (not illustrated) of the substrate 10.

The drain electrode is formed of three metallizations 41, 42, and 43 slightly thinner than the source metallizations extending downward from the drain manifold $DM_i$ into the region between the four source metallizations 31–34.

The signal (or Number 1) gate electrode is formed of six thin finger like metallizations 44–49 extending upwardly from the signal gate manifold $G1M_i$ into six regions defined between source and drain metallizations. The signal gate manifold ($G1M_i$) extends horizontally across the SDGFET, and is fed with signals coupled from the left and couples signals into the next $(i+1)^{th}$ SDGFET to the right. The fingers 44–49 of the signal gate electrode are disposed in each of the six regions in closer proximity to the source fingers than to the drain fingers and are separated from the drain fingers by the fingers 51–56 of the control (or Number 2) gate electrode, not yet characterized. Assuming that the six source drain bonded regions are all active, the transconductance of the SDGFET so far depicted, may be approximated by summing up the gate widths in the regions between the interdigital source and drain fingers 41-31; 41-32; 32-42; 42-33; 33-43; and 43-34.

The gate width dimensions of the individual segments A, B, C, and D of the SDGFET which are selectively activated are defined by the structure of the control (or Number 2) gate electrode.

The control or Number 2 gate electrode consists of six narrow metallizations (51-56) extending upwardly into the six source drain regions defined above, and which when selectively activated define the active segments A, B, C, and D of the SDGFET. The metallizations of the control gate electrodes fit into the identified regions between the signal (Number 1) gate fingers and the drain fingers. At their lower ends these metallizations cross the signal gate manifold via air bridges and are in turn connected to four metallizations (37-40) remote from the SDGFET gate region, and which form the upper plates of the capacitors $C_A$, $C_B$, $C_C$, and $C_D$ illustrated in the schematic diagram of FIG. 3B.

In particular, the A segment of the SDGFET is established by the two fingers 54 and 55 which after crossing the signal gate manifold are connected in common to the metallization 37. The metallization 37 forms the upper plate of the capacitor $C_A$ (see FIG. 3B), the lower plate of which is grounded metallization 35. The upper plate is supported over the lower plate by means of an insulating layer not shown. The metallization 37 leads via a resistance R to the A control bus (and thence to the control pad $P_A$). Thus when the A control bus is set to an activating voltage, the gate width controlled by the two fingers 54 and 55 is activated. In the exemplary embodiment, the "A" segment has an 81 micron gate width, the sum of two gate regions, each of 40.5 microns width.

The B segment of the SDGFET is established by the two fingers 52 and 53, which after crossing the signal gate manifold are connected in common to the metallization 38. The metallization 38 forms the upper plate of the capacitor $C_B$ (see FIG. 3B), the lower plate of which is the grounded metallization 35. The upper plate is supported over the lower plate by means of an insulating layer not shown. The metallization 38 leads via a resistance R to the B control bus (and thence to the control pad $P_B$). Thus, when the B control bus is set to an activating voltage, the gate width controlled by the two fingers 52 and 53 is activated. In the exemplary embodiment, the "B" segment has a 72 micron gate width, the sum of two gate regions, each of 36 microns width.

The C segment of the SDGFET is established by the finger 56 which after crossing the signal gate manifold is connected to the metallization 39. The metallization 39 forms the upper plate of the capacitor $C_C$ (see FIG. 3B), the lower plate of which is the grounded metallization 35. The upper plate is supported over the lower plate by means of an insulating layer not shown. The metallization 39 leads via a resistance R to the C control bus (and thence to the control pad $P_C$). Thus, when the C control bus is set to an activating voltage, the gate width controlled by the single finger 56 is activated. In the exemplary embodiment, the "C" segment has a 26 micron gate width.

The D segment of the SDGFET is established by the finger 51, which after crossing the signal gate manifold is connected to the metallization 40. The metallization 40 forms the upper plate of the capacitor $C_D$ (see FIG. 3B), the lower plate of which is the grounded metallization 35. The upper plate is supported over the lower plate by means of an insulating layer not shown. The metallization 40 leads via a resistance R to the D control bus (and thence to the control pad $P_D$). Thus, when the D control bus is set to an activating voltage, the gate width controlled by the finger 51 is activated. In the exemplary embodiment, the "D" segment has a 20 micron gate width.

The $i^{th}$ SDGFET just described thus has four segments (A, B, C, and D), each of predetermined gate width. Each width has been selected to achieve a desired transconductance, so that when each segment or each combination of segments is activated a desired transconductance in a desired series of transconductances is provided in the $i^{th}$ SDGFET.

Further in accordance with the invention, each of the five SDGFETs are of the same design and a control network best seen in FIG. 1 is provided for achieving selective activation of the segments of each SDGFET. The control network is designed to cause all five SDGFETs to assume like $g_m$ states simultaneously. As already noted in connection with FIGS. 3A and 3B, the individual segments of the $i^{th}$ SDGFET are connected in inverse order of gate width (i.e. 81, 72, 26, 20μM) to the respective control buses A, B, C, and D. This ordering is also true of the other four SDGFETs.

The control buses of the control network may be identified by the associated pads $P_A$, $P_B$, $P_C$, and $P_D$. Thus for example, the pad $P_A$ is connected to the second bus from the bottom, the "A bus", and it leads to the A segments of all five SDGFETs; and the same method of nomenclature is repeated for the B, C, and D buses.

The control network further includes filtering to prevent RF coupling between SDGFETs which may arise by the common connection of control gates from different SDGFETs to the A, B, C, and D buses. In particular: capacitors $C_3$ and $C_7$ are coupled to the "D bus" at two points; capacitors $C_4$ and $C_8$ are coupled to the "B bus" at two points; capacitors $C_5$ and $C_9$ are coupled to the "A bus" at two points; and capacitors $C_6$ and $C_{10}$ are coupled to the "C bus" at two points.

The networks by which the drain and signal gate bias voltages are applied to the variable gain distributed amplifier are also illustrated in FIGS. 1 and 2. The source electrodes are at ground potential and necessary connections at the top surface of the substrate 10 for filter capacitors and for external connections are made by means of via holes. Via holes, often identifiable in FIG. 1 by octagnal metallizations are provided at the pads labelled $P_{GND}$, at each of the set of four capacitors adjacent each of the SDGFETs and in the vicinity of the capacitors $C_{12}$, $C_{13}$ and $C_{15}$. The drain potential is applied to the pad PDR via a three section low pass filter consisting of the shunt capacitors $C_{12}$, $C_{13}$, and $C_{14}$ and the series inductors $L_5$, $L_6$ and $L_7$. In addition, the resistors $R_1$, $R_2$ and the capacitor $C_{15}$ provide a path for supplying drain potentials to the SDGFETs and in addition a matched terminating impedance for the drain connected transmission line. The low pass filter structure for the drain supply has a cut-off frequency of 2 GHZ consistent with SDGFET operation above 3 GHZ. The resistors $R_6$, $R_7$ and capacitor $C_{11}$ also provide a matched terminating impedance for the signal gate connected transmission line in addition to the path for supplying bias to the signal gates of the SDGFETs.

The drain and gate biases are typical. The drain bias referenced to ground at the pad $P_{DR}$ is 8 volts which falls to about 5 volts at the individual drain manifolds. The signal gate potential is typically −1 volt. The control potentials, which are selectively applied to the pads $P_A$, $P_B$, $P_C$, and $P_D$ for $G_m$ control, are respectively −3 volts for segment inactivation and from zero to +2 volts for segment activatation.

FIGS. 1, 2A, 2B, and 2C illustrate the RF signal paths essential to operation of the distributed amplifier. The five SDGFETs $T_1$ to $T_5$ are interconnected so as to become a part of two transmission line means. The first transmission line means couples signals from the signal input terminal $P_I$ to successive signal gate manifolds at which power division occurs, and the second transmission line means constructively combines the outputs at successive drain manifolds for propagation to the signal output terminal $P_O$.

In the first transmission line means, the open circuit stub, a metallization of which the pad $P_I$ is a part, and the signal gate to source capacity ($C_{GIS}$) of the five SDGFETs become six shunt capacitors, which in combination with the transmission line element $TRL_1$ and four serially connected inductors ($L_1$-$L_4$) form a five pi section low pass filter. Reflections in the filter are avoided by a 50 Ω resistive termination connected to bypass capacitor $C_{11}$.

In the second transmission line means, the drain to source capacity $C_{DS}$ of the five SDGFETs become the shunt capacitors and five transmission line sections between drains become the serial inductors of a five section low pass filter. The second low pass filter is terminated in a network leading to the pad $P_{DR}$ at which the bias for the drain is applied. The first three filter sections of the second transmission line means include series diplexers to avoid instability within the distributed amplifier. As will be explained, the design of the individual sections of both transmission lines means are optimized to achieve a more desirable lower ripple broadband response, using an equal ripple Chebyshef approach.

Figure 2A:
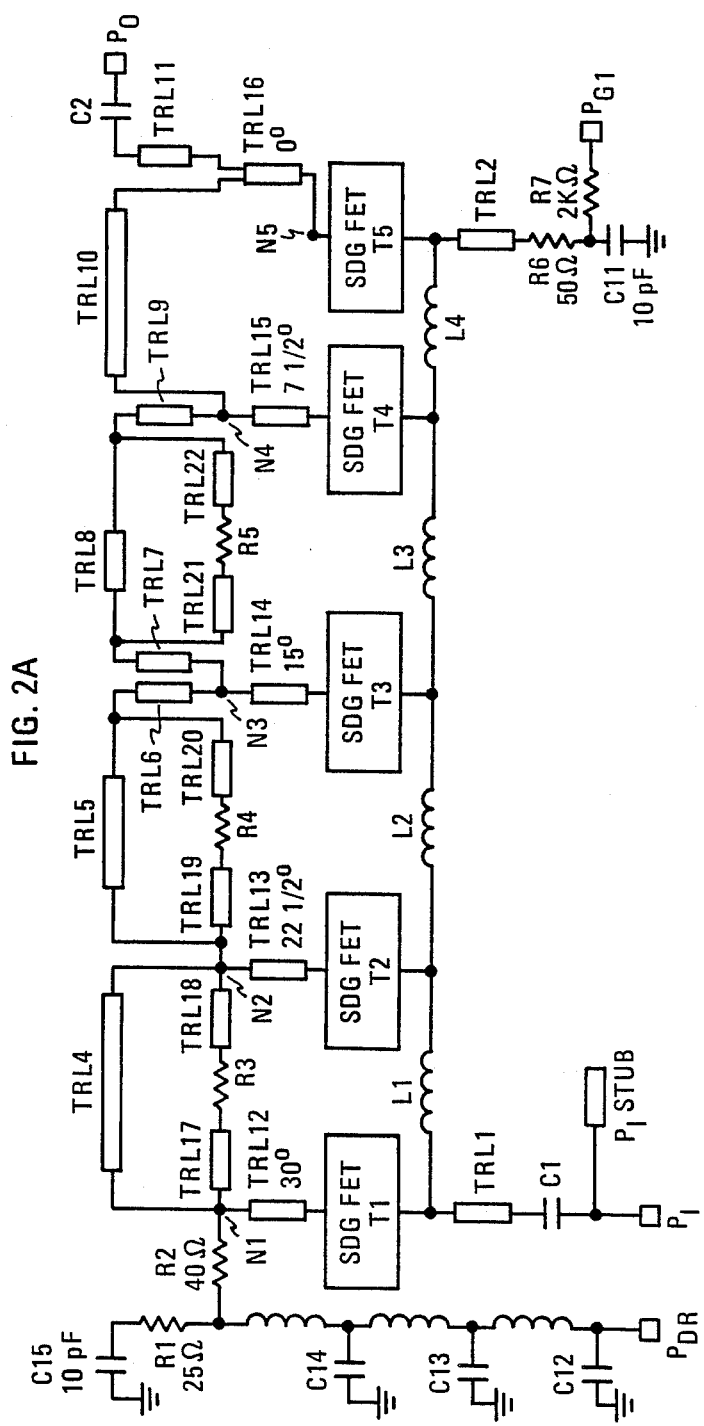
FIG. 2A is a schematic representation of the variable gain distributed amplifier illustrated in FIG. 1 in which the active devices are segmented dual gate field effect transistors (SDGFETs), represented in FIG. 2A by simple blocks.
Figure 2B:
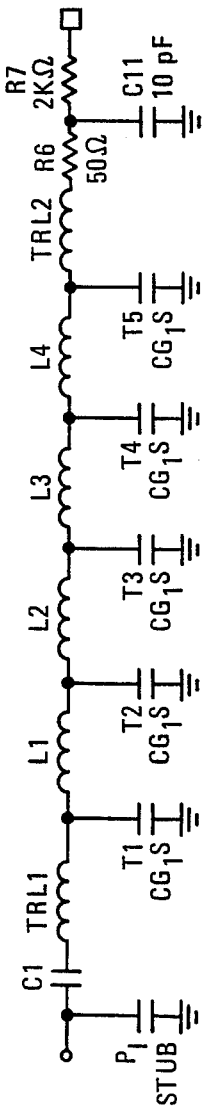
FIG. 2B is a simplified representation of the low pass filter structure incorporating the signal gate of the transistors.

The layout of the first transmission line means incorporating the signal gates of SDGFETs $T_1$ to $T_5$ is shown in FIG. 1. The electrical circuit is shown in FIGS. 2A and 2B, with FIG. 2B showing a simplified equivalent form of the transmission line means.

The signal is coupled to the pad $P_I$ with the open circuit stub and then coupled via a blocking capacitor $C_1$ to a first terminal of a first transmission line section $TRL_1$. The second terminal of $TRL_1$ is coupled to the signal gate manifold of the SDGFET $T_1$. The open circuit stub of the pad $P_I$ presents a shunt capacity to ground, roughly half that of the signal gate to source capacity ($C_{GIS}$). The signal gate to source capacity ($C_{GIS}$) of $T_1$, provides a shunt capacity to ground at the second terminal of the transmission line $TRL_1$. The remaining four sections of the filter utilize the inductances $L_1$ to $L_4$ as serial elements and capacities $C_{GIS}$ of transistors $T_2$ to $T_5$ as shunt elements. The last transmission line section $TRL_2$ is small and does not significantly affect the properties of the filter. (The last shunt capacity of $T_5$ is twice that of the exact iterative design.) The last filter section is resistively terminated by the 50 ohm resistance $R_6$ and the 10 pf capacitor $C_{11}$.

The foregoing transmission line structure which couples the RF input signal to the signal gates, utilizes the serial inductances ($TRL_1$, $L_1$-$L_5$) to compensate the shunt capacitances ($C_{GIS}$) at the signal gates, thereby creating an artificial transmission line having a suitably high cut-off frequency to pass signals up to 20 GHZ, and a characteristically low signal attenuation through the pass band. The shunt capacity ($C_{GIS}$) of each SDGFET is essentially unaffected by the $G_m$ state (i.e. segment activation) due to the nature of the SDGFET and is equal to that of all segments of the device. Thus the properties of the transmission line are substantially unaffected by the $G_m$ settings. Since a filter having precisely identical sections will exhibit excessive "ripple" in the pass band, (although usefully enhancing the steepness of the skirts at the cut-off frequency), a practical design requiring smoothness in the pass band dictates detuning individual stages in accordance with the equal ripple Chebyshef technique. Since precisely matched $G_m$ control is sought in each of the SDGFETs, the detuning is achieved in the first stage by adjustment of the open stub at $P_I$ away from $C_{GIS}/2$, and by a selection of an inductance for $TRL_1$, $L_1$ and $L_2$ which is slightly smaller than that of $L_3$ and $L_4$. In addition, the shunt capacitance for the last stage $C_{GIS}$, which is the same as the other transistors, provides additional detuning in that it is double that of the iterative design. Any excess detuning due to the oversized capacitance is reduced by the closeness of the output terminal, which "swamps" the capacitance.

The design may be readily scaled to differing cut-off frequencies to which MMIC techniques are applicable. The use of a resistive termination ($R_6$, $C_{11}$) reduces reflections in the artificial transmission line, avoids consequent instability, and improves the filter performance.

Figure 2C:
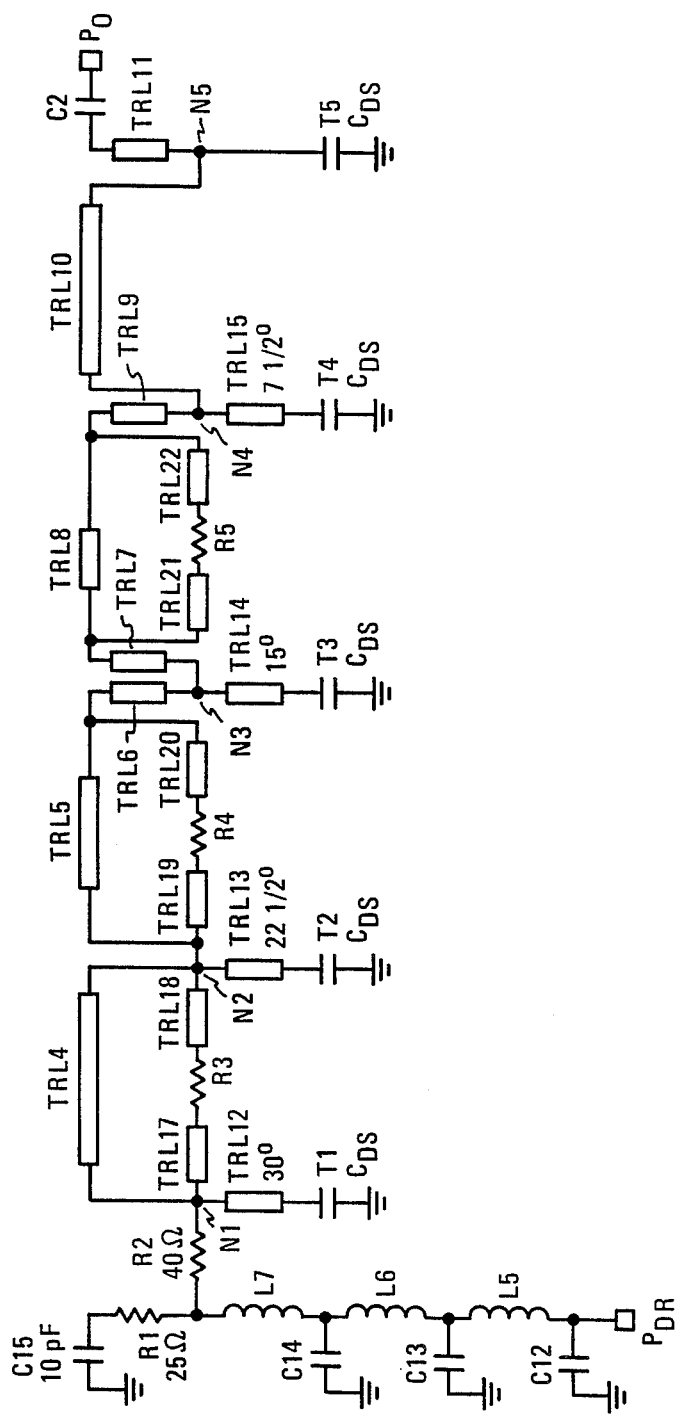
FIG. 2C is a simplified schematic of the low pass filter structure incorporating the drain to source capacity of the transistors. Also shown is a bias low pass structure.

The layout of the second transmission line means which incorporating the drains of the SDGFETs $T_1$ to $T_5$ and transmission line elements $TRL_4$ to $TRL_{22}$ is shown in FIG. 1. The electrical circuit is shown in FIGS. 2A and 2C, with FIG. 2C showing a simplified equivalent form of the second transmission line means. As earlier noted, the amplified signal appears at each of the drain manifolds of the transistors $T_1$ to $T_5$ and these outputs are constructively combined for propagation to the signal output terminal $P_O$.

In the circuit of the second transmission line means, the signal appearing at the drain manifold of the transistor $T_1$ is coupled via the transmission line $TRL_{12}$ to a first node $N_1$. Similarly the signal which appears at the drain manifold of the transistor $T_2$ is coupled via the transmission line $TRL_{13}$ to the node $N_2$; the drain manifold of the transistor $T_3$ is coupled via the transmission line $TRL_{14}$ to the node $N_3$; the drain manifold of the transistor $T_4$ is coupled via the transmission line $TRL_{15}$ to the node $N_4$; and the drain manifold of the transistor $T_5$ is coupled via the virtually absent transmission line $TRL_{16}$ of 0° to the node $N_5$.

The transmission line $TRL_4$ interconnects the nodes $N_1$ and $N_2$; the serially connected transmission lines $TRL_5$ and $TRL_6$ interconnect the nodes $N_2$ and $N_3$; the serially connected transmission lines $TRL_7$, $TRL_8$ and $TRL_9$ interconnect the nodes $N_3$ and $N_4$; and the transmission line $TRL_{20}$ and $TRL_{16}$ (which is ideally zero degrees) interconnect the nodes $N_4$ and $N_5$. In addition, serially connected transmission line $TRL_{17}$, resistance $R_3$ and transmission line $TRL_{18}$ interconnect nodes $N_1$ and $N_2$; serially connected transmission line $TRL_{19}$, resistance $R_4$; and transmission line $TRL_{20}$ make connection to node $N_2$ and shunt the transmission line $TRL_5$; and serially connected transmission line $TRL_{21}$, $R_5$; and transmisison line $TRL_{22}$ shunt the transmission line $TRL_8$.

The initial node $N_1$ provides the means for insertion of the drain bias via the resistance $R_2$ and a 3-section low pass filter consisting of inductors $L_5$, $L_6$ and $L_7$ and capacitances $C_{12}$, $C_{13}$, and $C_{14}$ as earlier noted.

A resistive termination at the node $N_1$ for radio frequency purposes is provided by the resistors $R_1$ and $R_2$ and the capacitor $C_{15}$.

The node $N_5$ is coupled via a short length of transmission line $TRL_{11}$ (omitting $TRL_{16}$) via the capacitor $C_2$ to the signal output pad $P_O$.

The second transmission line means is designed to provide a four section constant K, equal ripple Chebyshef filter. As was true in relation to the signal gate to source capacity ($C_{GIS}$), the drain to source capacity ($C_{DS}$) of each SDGFET remains equal to the total drain to source capacity, although less than all of the segments are active.

The drain connected transmission line segments $TRL_{12}$–$TRL_{16}$ are set to reduce the effective drain source capacity by differing amounts. In the case of transistor $T_1$, the transmission line segment $TRL_{12}$ has an electrical length of 30° at cut-off, and provides the maximum series inductance to reduce the drain source capacity ($C_{DS}$) the most. The succeeding transmission line segments $TRL_{13}$, $TRL_{14}$, $TRL_{15}$ each have successively shorter electrical lengths; corresponding respectively to electrical lengths of $22\frac{1}{2}°$, 15°, and $7\frac{1}{2}°$. The last (virtual) segment $TRL_{16}$ has an electrical length of 0° and thus is not present in a practical sense.

The successively increased shunt connected capacitive reactances and the transmission line elements ($TRL_4$ to $TRL_{10}$) serially connected between successive transistor drains form a low pass filter, in which the compensating effect of the serial inductances produces successively smaller compensations relative to the shunt capacity, an increase in the cut-off frequency, but in the pass band staggers the ripples in the amplitude and phase response.

The design so far described is intended to provide a path between the signal gate manifold of transistor $T_1$ and the signal gate manifold of the transistor $T_2$ equal in electrical length to that between the drain manifold of transistor $T_1$ and the drain manifold of the transistor $T_2$. Similar equalities are observed for the paths between the signal gates and between the drains of $T_2$ and $T_3$, and the paths between the signal gates and between the drains of $T_3$ and $T_4$, and finally the paths between the signal gates and between the drains of $T_4$ and $T_5$.

In practice, the electrical lengths of the paths between the drains $T_1$-$T_2$; $T_2$-$T_3$; $T_3$-$T_4$; and $T_4$-$T_5$ are only approximately 90°. The electrical lengths of the paths between the drains $T_1$ and $T_2$, and between $T_3$ and $T_4$ are slightly longer than average; between $T_2$ and $T_3$ approximately average; and between $T_4$ and $T_5$ shorter than average.

The final elements in the second transmission line means are the series diplexer structures provided in the paths between the drain of transistor $T_1$ and $T_2$; $T_2$ and $T_3$; and $T_3$ and $T_4$ which supress oscillations in the distributed amplifier. In the path between $T_1$ and $T_2$ the first series diplexer consists of the serially connected transmission line section $TRL_{17}$, the resistance $R_3$, and the transmission line section $TRL_{18}$ connected between nodes $N_1$ and $N_2$. In the path between transistors $T_2$ and $T_3$, the second series diplexer consists of the serially connected transmission line section $TRL_{19}$, resistance $R_4$ and transmission line 20 connected between the node $N_2$ and the connection between transmission line $TRL_5$ and $TRL_{16}$. In the path between transistors $T_3$ and $T_4$ the third series diplexer consists of the serially connected transmission line section $TRL_{21}$, the resistance $R_5$ and the transmission line section $TRL_{22}$. The third series diplexer is connected between the transition between the transmission lines $TRL_7$ and $TRL_8$, and between $TRL_8$ and $TRL_9$.

The three diplexers connected in the paths between the drain connected nodes $N_1$, $N_2$, $N_3$, $N_4$ form a second series path containing a compensating inductance analogous to that provided by the transmission lines $TRL_4$, $TRL_5$ and $TRL_8$. The diplexers thus provide alternate paths for signals to travel between the drain connected nodes in parallel with the principal paths provided by transmission lines $TRL_4$, $TRL_5$ and $TRL_8$.

The potential cause of instability that the diplexers are intended to remove is in mismatches occurring in the paths between drain connected nodes near the cut-off frequency of the distributed amplifier. Let us assume a mismatch causing a high VSWR reflection at node $N_1$. The mismatch, which produces potential instability, occurs when the low pass filter formed between transistors $T_1$, $T_2$, plus the low pass filters which are between $T_3$, $T_4$, and $T_5$, which are in series and increasing the mismatch at $T_1$ (neglecting the diplexers), goes into cut-off. At this point, the current drops to a minimum presenting a high reflection coefficient as viewed at the ideal generator in $T_1$. This condition reflects $T_1$'s signal output at the drain back to $T_1$'s signal gate, the feedback path and source of potential instability being completed by the internal capacity within the transistor $T_1$ between the drain and the signal gate.

The diplexers reduce instability by de"Q"ing the inductive reactances between drain connected nodes. More particularly, the first diplexer ($TRL_{17}$, $R_3$ - $TRL_{18}$) contains a large valued resistance $R_3$, and thus acts as a resistance in parallel with the parallel tuned tank formed by $TRL_4$ and $T_1$. At cut-off $TRL_4$ and $T_1$ form the majority of a parallel resonant network with a very high resultant impedance. The parallel diplexer acts to lower the high impedance thus reducing drain reflections and instability. $TRL_5$ and $T_2$, $TRL_8$ and $T_3$, $TRL_{10}$ and $T_4$ also form the major part of parallel resonators. The first two are de"Q"ed by associated diplexers.

The diplexers are dimensioned to de"Q" the resonance of the output low pass filters reducing reflections and thus reducing the amount of degeneration near the cut-off frequency. At frequencies below cut-off, the termination at node $N_1$ is more nearly matched, and reflections are reduced and instability is not a problem.

The diplexers, which are placed in three of the four individual sections of the distributed amplifier, prevent instability within the individual sections, as well as within the full distributed amplifier. The loading on the last stage generally avoids the need for a diplexer in the last section. In the diplexer design, the transmission line elements (e.g. $TRL_{17}$, $TRL_{18}$) are of substantially higher impedance that the shunt elements (e.g. 83 vs 63 ohms), the large (2000 ohms) serial resistances (e.g. $R_3$) sustain a resistance for appropriately de"Q"ing the inductive reactances at the cut-off frequencies. The parallel placement of the diplexer plus its high resistance, avoids reducing forward gain in the pass band.

The diplexers present in all but the last section of a distributed amplifier avoid an instability which may be present when a multisection filter possesses a lower cut-off frequency than that at the outputs of preceeding sections. In effect, the accumulative pass band at the output of each filter section except for the last, is greater than that of the total filter, and thus a reflection causing mismatch at the upper limits of the frequency spectrum, potentially causing instability, may occur. The problem is a common one, and the diplexers herein described solve a common problem in distributed amplifiers.

The advantage of the present novel configuration, in which the diplexers parallel the drain connected nodes, as opposed to providing by-pass paths from drains to ground, is that it produces the requisite stability to the distributed amplifier with essentially no roll-off in gain within the pass band.

The foregoing design is readily computer optimized for differing design applications. In general, five sections are adequate and optimum when a bandwidth with a phase and gain response flat to 1 db is sought over a frequency range of 6 to 1. A narrower bandwidth may require a smaller number of sections, while a wider bandwidth may dictate a greater number of sections. The diplexer design (path lengths, characteristic impedances, resistances, etc.) is readily computer optimized. The length of the diplexer, for instance, is adjusted to achieve maximum stability in the cut-off region. The transmission line layout dipicted in FIG. 1 is the result of a computer optimization in an exemplary distributed amplifier.

Figure 4:
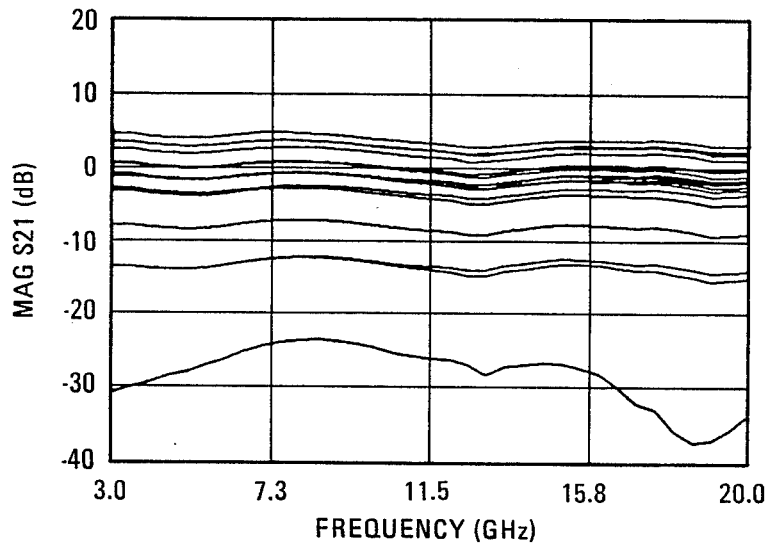
FIG. 4 is a graph of forward gain performance in decibels vs frequency of an embodiment of the distributed amplifier at successive gain settings.
Figure 5:
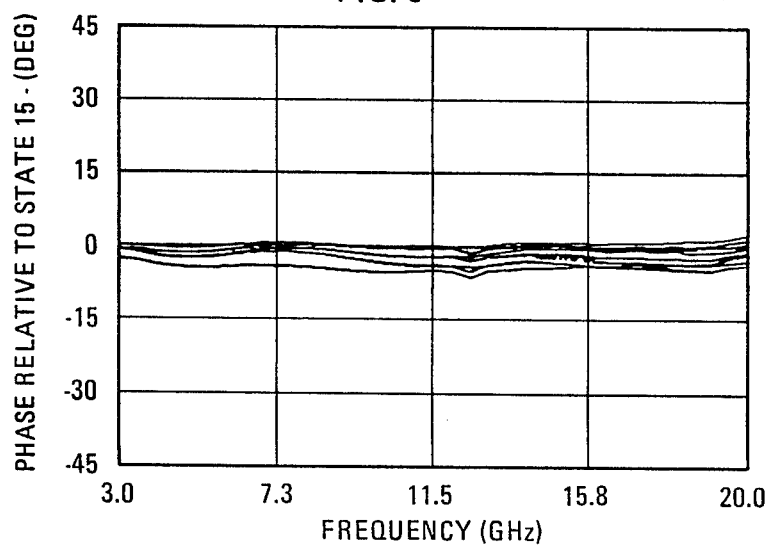
FIG. 5 is a graph of the forward gain phase performance in degrees vs frequency of an embodiment of the distributed amplifier at successive gain settings.

The performance of an exemplary distributed amplifier is illustrated in FIGS. 4 and 5. The graphed pass band is between 3 and 20 GHZ, and the settings vary from a gain of about 5 db to an attenuation of about 25 db (where flatness is unimportant). The gain response is smooth due to the equal ripple Chebyshef design to about 1 db at all but the lower two gain settings (representing an improvement from about 2½ db over the iterative design). The phase response is essentially flat and remains generally within ±2½° except for the last three (attenuation) settings - not shown - which reach approximately −15° of phase.

The essential electrical parameters of the distributed amplifier, which facilitate broadband operation to 20 GHZ in the example, favor a strictly monolithic format. The common substrate is of a material suitable for high speed semiconductor operation, such as GaAs. The undersurface is metallized to form a signal ground, while the upper surface supports the formation of the active devices such as the SDGFETs, and the passive devices. Conductive runs become microstrip transmission lines, and with appropriately dimensioned semi-insulating substrates, are efficient and of convenient characteristic impedances (e.g. 50 ohms). The conductive runs also provide inductances as needed in either a linear or helical (octagonal) format. Capacitors are readily formed in place on the upper surface of the substrate with via holes providing signal grounds available on the upper surface of the substrate.

The nearly constant phase response over a wide band and in stepping from one gain setting to another depicted in FIG. 5 is attributable to the use of segmented dual gate FETs in each section of the distributed amplifier, the critical capacitances of the FETs (e.g. $C_{G1S}$, $C_{DS}$) being invariant with segment selection.

The selection of gain settings by segment selection was designed to approximate a sine/cosine function for vector formation. The segment selections, depending upon application, may produce linear, nonlinear, binary, quadratic, logarithmic, trigonometric, or other gain scaling at the user's discretion.

What is claimed is:

1. A variable gain distributed amplifier comprising
   (A) a signal input terminal for application of signals to the distributed amplifier;
   (B) m segmented dual gate field effect transistors (SDGFETs), each similarly subdivided into n selectively activated segments,
   each SDGFET having source, drain, and signal gate electrodes common to all segments with corresponding manifolds, and a control gate electrode divided into n segments disposed between the signal gate electrode and the drain electrode; and n control gate terminals, each control gate terminal selectively activating an associated segment of the SDGFET,
   each SDGFET segment having a predetermined width to effect a desired increment in SDGFET transconductance ($G_m$) when activated, the signal gate manifold to source capacitance ($C_{G1S}$) and the drain manifold to source capacitance ($C_{DS}$) remaining constant and substantially unaffected by segment inactivation;
   (C) a first wideband low pass transmission line means for propagating signals from said signal input terminal to said successive signal gate manifolds at which power division occurs,
   said first transmission line means consisting of m successive shunt capacities to signal ground provided by the signal gate to source capacities ($C_{G1S}$) of said SDGFETs, and (m−1) serial first inductances interconnecting said signal gate manifolds in succession to effect a more wideband response and higher cut-off frequency;
   (D) a signal output terminal for the distributed amplifier;
   (E) a second wideband low pass transmission line means into which signals from said successive drain manifolds are constructively combined for propagation to said signal output terminal,
   said second transmission line means comprising m successive shunt capacities to signal ground provided by the drain to source capacities ($C_{DS}$) of said SDGFETs, and (m−1) serial second inductances interconnecting m nodes in succession, to each of which a corresponding drain manifold is coupled to effect a more wideband response and higher cut-off frequency; and
   (F) a control network connected to said control terminals of said SDGFETs for selectively activating corresponding segments in each of said SDGFETs to effect equal $G_m$s in each SDGFET, the state of activation of said SDGFETs having a minimum effect upon the phase response of said distributed amplifier.

2. The combination set forth in claim 1, wherein
   said variable gain distributed amplifier is a monolithic microwave integrated circuit (MMIC), having a substrate,
   said m SDGFETs being fabricated on said substrate, and said inductances being formed of conductor runs on one surface of said substrate, the other surface thereof having a conductive layer forming said signal ground to support microstrip propagation.

3. The combination set forth in claim 2, having in addition thereto
   resistance means coupled between the final signal gate manifold and said signal ground to terminate said first transmission line means to minimize reflections, and
   resistance means coupled in series with a capacitor between the initial drain manifold and said signal ground to terminate said second transmission line means to minimize reflections.

4. The combination set forth in claim 2, having in addition thereto,
(m−2) series diplexers connected in parallel with portions of said second inductances prior to the last, each diplexer including a serial resistance to de"Q" the associated inductance near the cut-off frequency to avoid amplifier instability.

5. The combination set forth in claim 4, having in addition thereto
m third inductances, each interconnecting successive drain manifolds to the associated nodes and formed of conductor runs disposed over said conductive layer to support microstrip propagation, and wherein
said m third inductances are arranged to produce differing delays in electrical degrees to facilitate smoothing the amplifier response below cut-off.

6. The combination set forth in claim 5, wherein the values of said first inductances, said second inductances, and said third inductances are assigned to form a stagger tuned Chebyshef equal ripple filter.

7. The combination set forth in claim 6, wherein said serial resistances of said diplexers are insertes between two conductor runs, disposed over said conductive layer to support microstrip propagation at a high characteristic impedance relative to the microstrip propagation by said second inductance.

8. The combination set forth in claim 7 wherein:
the electrical length of the path from drain manifold $DM_i$ to $DM_{(i+1)}$ and the electrical length of the path from signal gate manifold $G1M_i$ to $G1M_{(i+1)}$ are approximately equal at the cut-off frequency, and the electrical length of successive said paths are distributed about 90 electrical degrees to facilitate said Chebyshef equal ripple response.

* * * * *